(12) United States Patent
Jensen et al.

(10) Patent No.: US 9,832,901 B2
(45) Date of Patent: Nov. 28, 2017

(54) PRINTED CIRCUIT BOARD MOUNTING AND GROUNDING DEVICE

(71) Applicant: Intel Corporation, Santa Clara, CA (US)

(72) Inventors: Ralph W. Jensen, Steilacoom, WA (US); Wesley B. Morgan, DuPont, WA (US); James T. Goulding, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 469 days.

(21) Appl. No.: 14/333,828

(22) Filed: Jul. 17, 2014

(65) Prior Publication Data

US 2016/0020538 A1    Jan. 21, 2016

(51) Int. Cl.
*H05K 7/14* (2006.01)
*H05K 1/02* (2006.01)
*H05K 9/00* (2006.01)

(52) U.S. Cl.
CPC .......... *H05K 7/142* (2013.01); *H05K 1/0215* (2013.01); *H05K 9/0039* (2013.01)

(58) Field of Classification Search
None
See application file for complete search history.

(56) References Cited

U.S. PATENT DOCUMENTS

| | | | | |
|---|---|---|---|---|
| 6,643,137 B1* | 11/2003 | Chung | ................... | H01L 23/367 165/185 |
| 2003/0178226 A1* | 9/2003 | Liu | ...................... | H01L 23/4093 174/252 |
| 2011/0141699 A1* | 6/2011 | Hager | .................... | H05K 3/308 361/720 |

* cited by examiner

*Primary Examiner* — Courtney Smith
*Assistant Examiner* — Jessey R Ervin
(74) *Attorney, Agent, or Firm* — Schwabe, Williamson & Wyatt, P.C.

(57) ABSTRACT

Embodiments of the present disclosure are directed toward techniques and configurations for a printed circuit board (PCB) assembly mountable to a computer chassis. In one instance, the PCB assembly may comprise a PCB having two through holes and a PCB mounting device that may include a U-shaped component having a non-linear portion and two rods extended from the non-linear portion and a housing having a base with protrusions extending from ends of the base. The rods may be extended through the protrusions such that the base and the non-linear portion of the U-shaped component form an opening to engage a mounting element of the chassis. The extended portions of the rods may be inserted into and soldered to the through holes of the PCB, to electrically couple the PCB to the PCB mounting device and the chassis to ground the PCB. Other embodiments may be described and/or claimed.

25 Claims, 9 Drawing Sheets

PRINTED CIRCUIT BOARD MOUNTING AND GROUNDING DEVICE

FIELD

Embodiments of the present disclosure generally relate to the field of printed circuit board design, and more particularly, to techniques and configurations for mounting structures providing desired grounding to printed circuit boards to be mounted on a chassis of a computing device.

BACKGROUND

Computing device assembly involves assembling device components, such as motherboard, hard drive, power supply elements, input/output panels, and other components, in a computer case, also known as a chassis, which come in different form factors, depending on a type of a device or computer system. For example, a chassis may include racks, modules, blade enclosures, cage-like structures, and the like. Assembling a computing device may include attaching computer components, e.g., backplanes or other panels to the chassis of a computing device or system. A backplane or other attachable panel may include a printed circuit board (PCB) or a wired circuit board having dense structures of circuits, connectors, slots, pins, vent openings, and other components. Accordingly, a PCB may have limited space to accommodate all desired circuits, routings, connections, and other components, including mounting structures to attach the PCB to the chassis. Also, due to high density and performance characteristics, a PCB (e.g., a backplane) may require adequate grounding arrangements.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
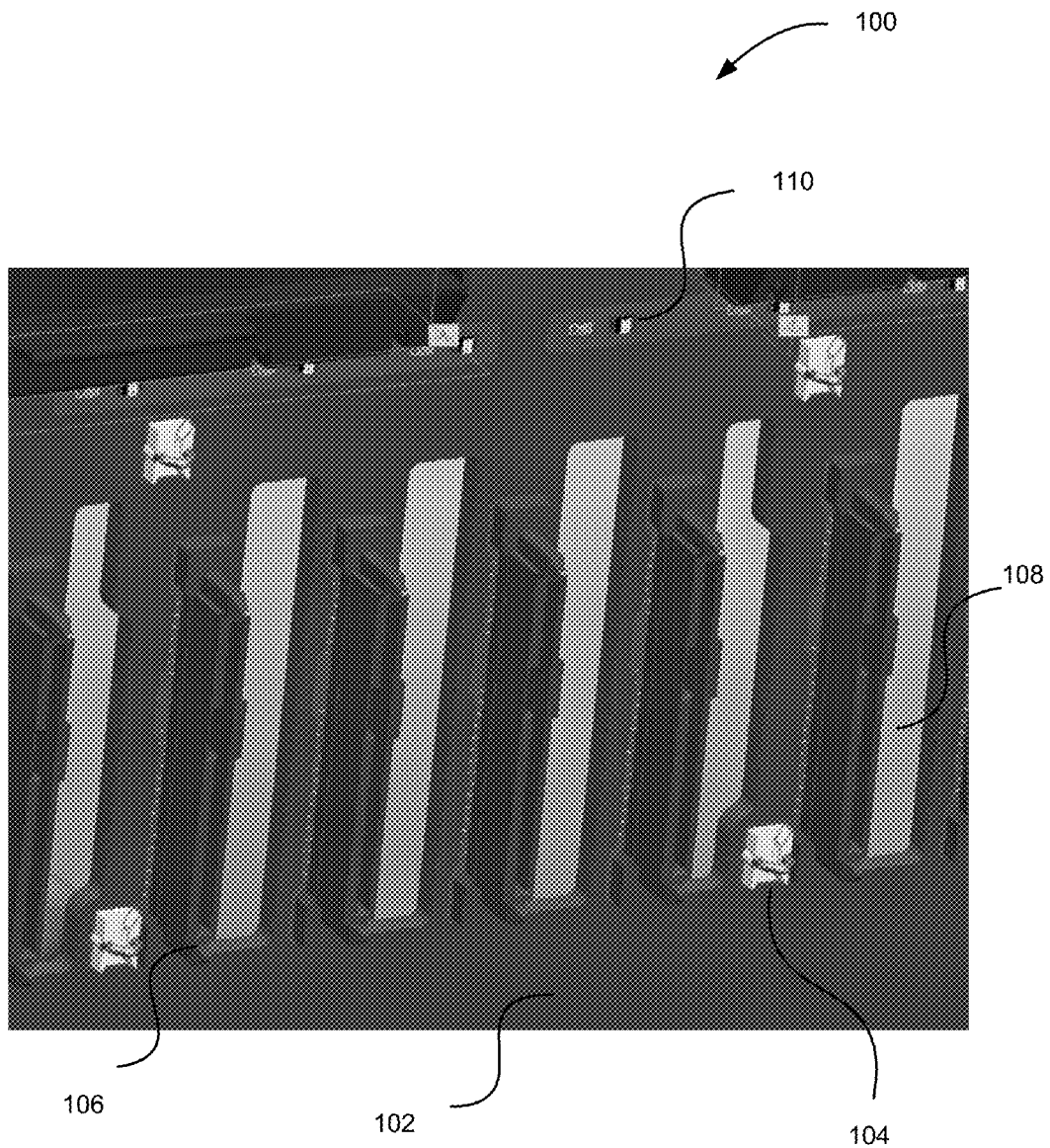
FIG. 1 illustrates a back view of an example printed circuit board (PCB) assembly, in accordance with some embodiments.

Embodiments of the present disclosure include techniques and configurations for a PCB assembly having a PCB mounting device configured to mount the PCB to a chassis, e.g., a computing system chassis, and ground the PCB to the chassis. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 illustrates a back view of an example printed circuit board (PCB) assembly 100, in accordance with some embodiments. The PCB assembly 100 may comprise a PCB 102 and one or more PCB mounting devices 104 removably coupled to the PCB 102 to mount the PCB to a chassis, e.g., a chassis of a computer system. By way of the example, the PCB 102 may be a backplane, although it should be understood that PCB 102 may comprise any type of a PCB that may be employed in an electronic or computing device or system, such as, but not limited to, a server, a collection of micro-servers, high-density multi-processor computer system, or other electronic systems.

The PCB 102 may comprise different structures disposed on the PCB, such as circuits, conductive lines (not shown), connector slots 106, vent openings 108, and other components 110. The PCB mounting device 104 may be attached to the PCB 102 in order to provide mounting to and electric coupling with a chassis of an electronic/computer system for grounding purposes as described in greater detail in reference to FIGS. 2-4.

Figure 2:
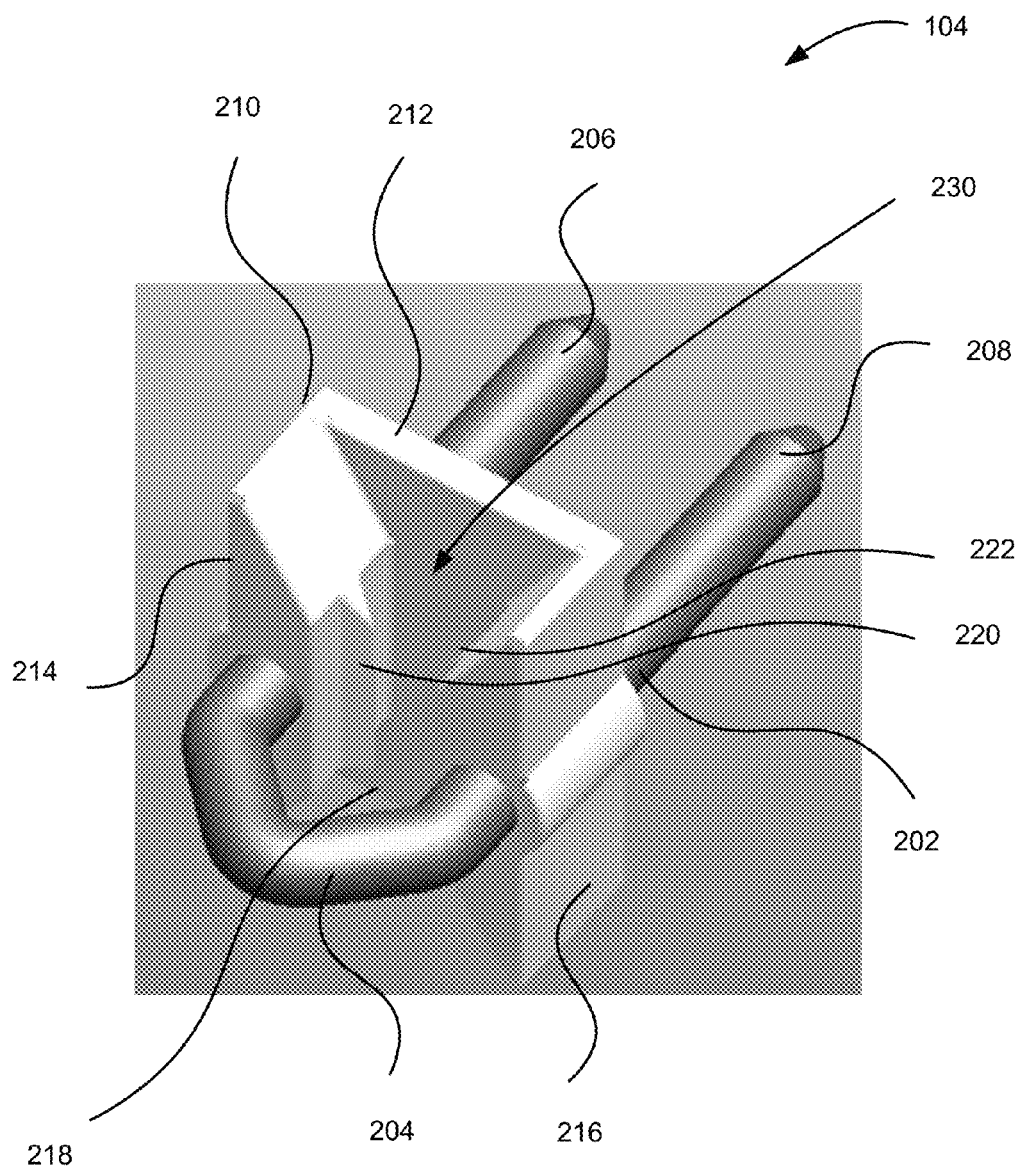
FIG. 2 schematically illustrates a 3-dimensional view of an example PCB mounting device configured to be removably coupled to a PCB to mount the PCB to a computing system chassis, in accordance with some embodiments.

FIG. 2 schematically illustrates a 3-dimensional view of an example PCB mounting device 104 configured to be removably coupled to a PCB to mount the PCB to an electronic/computing system chassis, in accordance with some embodiments. The PCB mounting device 104 may include a substantially U-shaped component 202 having a non-linear or curved portion 204 and first and second rods 206 and 208 extended from the non-linear or curved portion 204 as shown. As shown, the non-linear or curved portion 204 of the substantially U-shaped component 202 may be semicircular, or an arc. In other embodiments, the curved portion 204 of the substantially U-shaped component 202 may comprise a substantially triangular shape. In general, the shape of the non-linear or curved portion 204 may take different forms and is not limited to the illustrated example (hereinafter, simply referred to as "curved" portion). A shape of the curved portion 204 may be selected based on the technological requirements, for example, based on a shape of a mounting element of a chassis that the PCB mounting device 104 may be configured to engage, as described below in greater detail.

The PCB mounting device 104 may further comprise a housing 210 having a substantially quadrangular base 212. The base 212 may be non-quadrangular in shape in some embodiments and take any shape desirable for particular implementation. The base 212 may have first and second protrusions 214, 216 around each end of the base 212 to receive the first and second rods 206 and 208 of the substantially U-shaped component 202 respectively, as shown. Further, the first and second rods 206, 208 may be extended through the protrusions 214, 216 to be insertable into a PCB for mounting as discussed below in greater detail. The base 212 with the protrusions 214, 216, and the curved portion 204 may be configured to form an opening 218 to receive (engage) a mounting element of the chassis of an electronic/computing system as will be described below in greater detail. In some embodiments the rods may be made solderable to the PCB to provide grounding of the PCB via the PCB mounting device 104. For example, the U-shaped component 202 may be electrically plated or otherwise covered with a conductive material to provide the electrical coupling with the PCB.

In some embodiments, the protrusions 214, 216 of housing 210 may include guiding ribs 220, 222 that extend from the protrusions 214, 216 toward each other, to form a channel 230 in the opening 218 to guide a mounting element of the chassis through the opening 218, as described below in greater detail.

Figure 3:
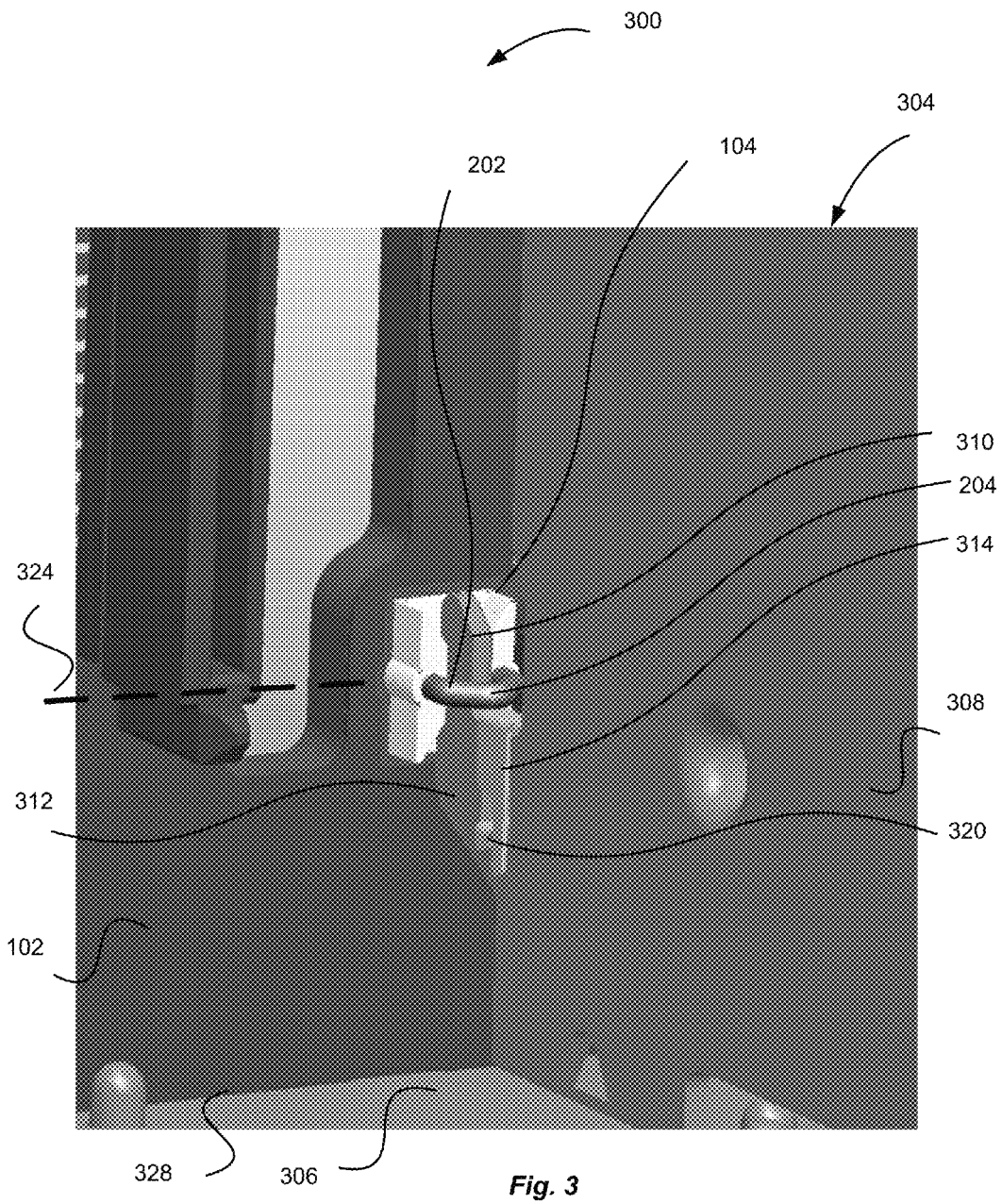
FIG. 3 schematically illustrates a 3-dimensional view of a portion of a PCB assembly with a PCB mounting device mounted to a chassis of a computing system, in accordance with some embodiments.

FIG. 3 schematically illustrates a 3-dimensional view 300 of a portion of a PCB assembly (e.g., 100) with a PCB mounting device (e.g., 104) mounted to a chassis of an electronic/computing system, in accordance with some embodiments. As shown, in the PCB assembly 100, the PCB mounting device 104 may be attached to the PCB 102 by insertion of the extended portions of the rods 206, 208 of the U-shaped component (shown in FIG. 2) into the through holes provided in the PCB to receive the rods 206, 208 of the U-shaped component 202. The rods 206, 208 may be soldered to the through holes, as described below in greater detail.

A chassis 304 may be configured to receive the PCB assembly 100 when the assembly is mounted to the chassis 304 through mounting mechanisms such as PCB mounting device 104. The chassis 304 may take different forms known to those skilled in the art. For example, the chassis 304 may include one or more cage-like structures having a floor section 306 and a partition wall 308. The partition wall 308 may include a mounting element complementarily configured to engage the PCB mounting device 104 of the PCB assembly 100. In some embodiments, the mounting element may comprise a hook-shaped component 310 that may extend from a partition wall 308 of the chassis 304, to lockably or frictionally engage with the opening of the PCB mounting device 104 (e.g., via the guiding ribs 220, 222 described in reference to FIG. 2). The hook-shaped component 310 may include a base section 312 having a grounding clip 314 attached to the base section 312 to receive at least a portion of the curved portion 204 of the U-shaped component 202, as shown.

As shown in FIG. 3, the grounding clip 314 may provide direct electric contact with the curved portion 204, to contribute to the grounding of the PCB 102 to the chassis 306 via the PCB mounting device 104. In some embodiments, the grounding clip 314 may have a substantially U-shaped form to saddle the base section 314, as shown. The grounding clip 314 may include a pin 320 that may extend through a through hole provided in the base section 312 to further contribute to grounding of the PCB assembly 100 to the chassis 304. The grounding clip 314 may be electrically plated or otherwise covered with a conductive material to provide the electrical coupling with the U-shaped component 202.

Figure 4:
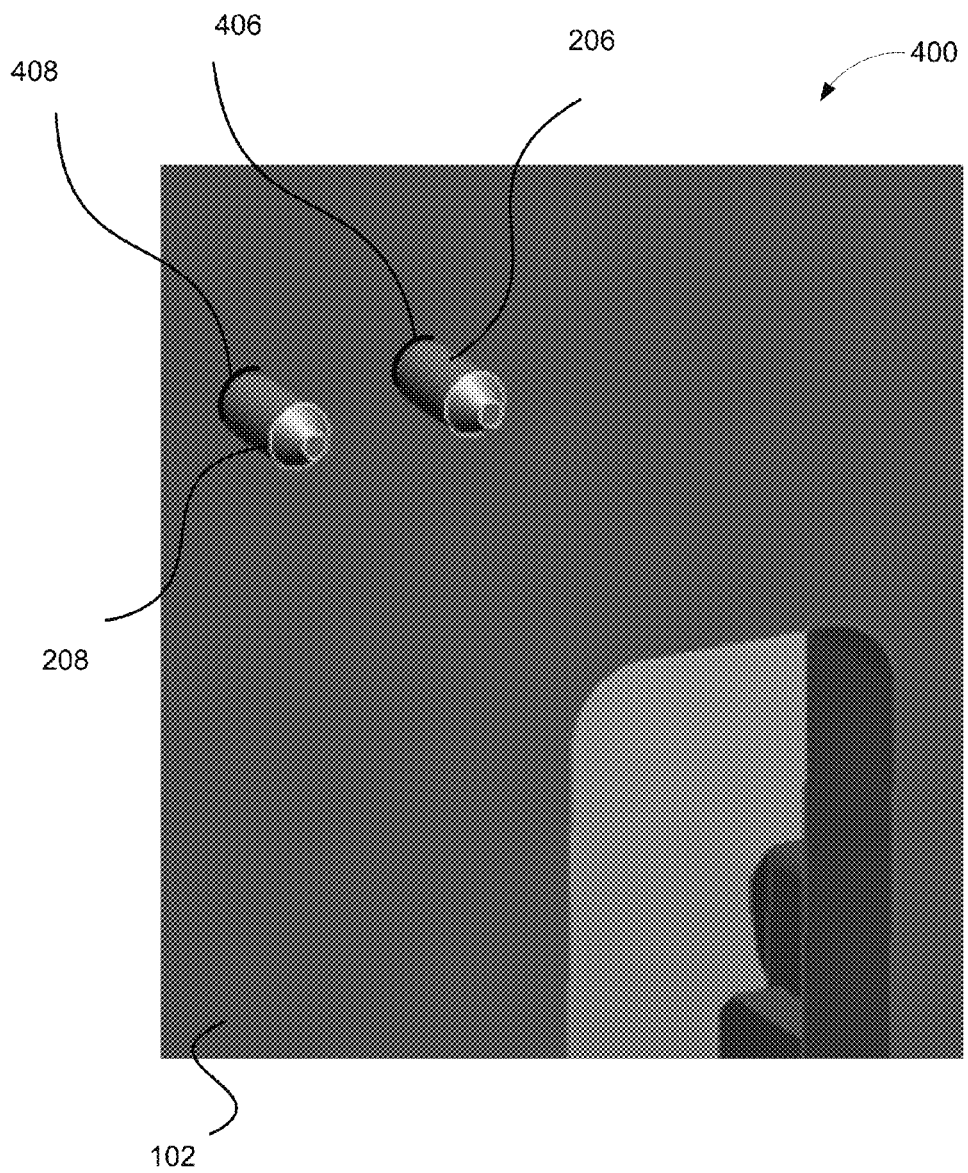
FIG. 4 schematically illustrates a front view of an example PCB assembly with a PCB mounting device attached to a PCB, in accordance with some embodiments.

FIG. 4 schematically illustrates a front view 400 of an example PCB assembly (e.g., 100) with a PCB mounting device (e.g., 104) attached to a PCB (e.g., 102), in accordance with some embodiments. As shown, the PCB 102 may include first and second through holes 406, 408 provided in the PCB 102 to receive the rods 206, 208 of the U-shaped component 202 of the PCB mounting device 104. In some embodiments, the PCB 102 may comprise a substantially quadrangular shape, and the first and second through holes 406, 408 may be disposed along a plane that is substantially parallel to one side of the quadrangle (e.g., horizontal side). For example, referring again to FIG. 3, the through holes 406, 408 may be provided along an imaginary line 324 (shown in dashed line) that may be parallel to the horizontal side 328 of the PCB 102 and, accordingly, to the floor 306 of the chassis 304. Such provision of the through holes 406, 408 in the PCB 102 may ensure desired alignment of the PCB 102 with the chassis 304, when mounted. For example, the PCB 102, when mounted to the chassis 304, may be disposed such that its horizontal side 328 is substantially parallel to the floor 306 of the chassis 304.

The through holes 406, 408 may be of a desired size and may be advantageously disposed such as to require a desired amount of space on the PCB 102, providing sufficient space for PCB components (e.g., vents, bus lanes, circuits, and such) as desired.

The through holes 406, 408 may be plated to enable electrical connection of a ground plane (not shown) of the PCB 102 with the first and second rods 206, 208. The extended portions of the first and second rods 206, 208 may be inserted into, and soldered to, the first and second through holes 406, 408 of the PCB 102, respectively, to electrically couple the PCB 102 to the PCB mounting device 104 and the chassis 304 to ground the PCB 102.

Figure 5:
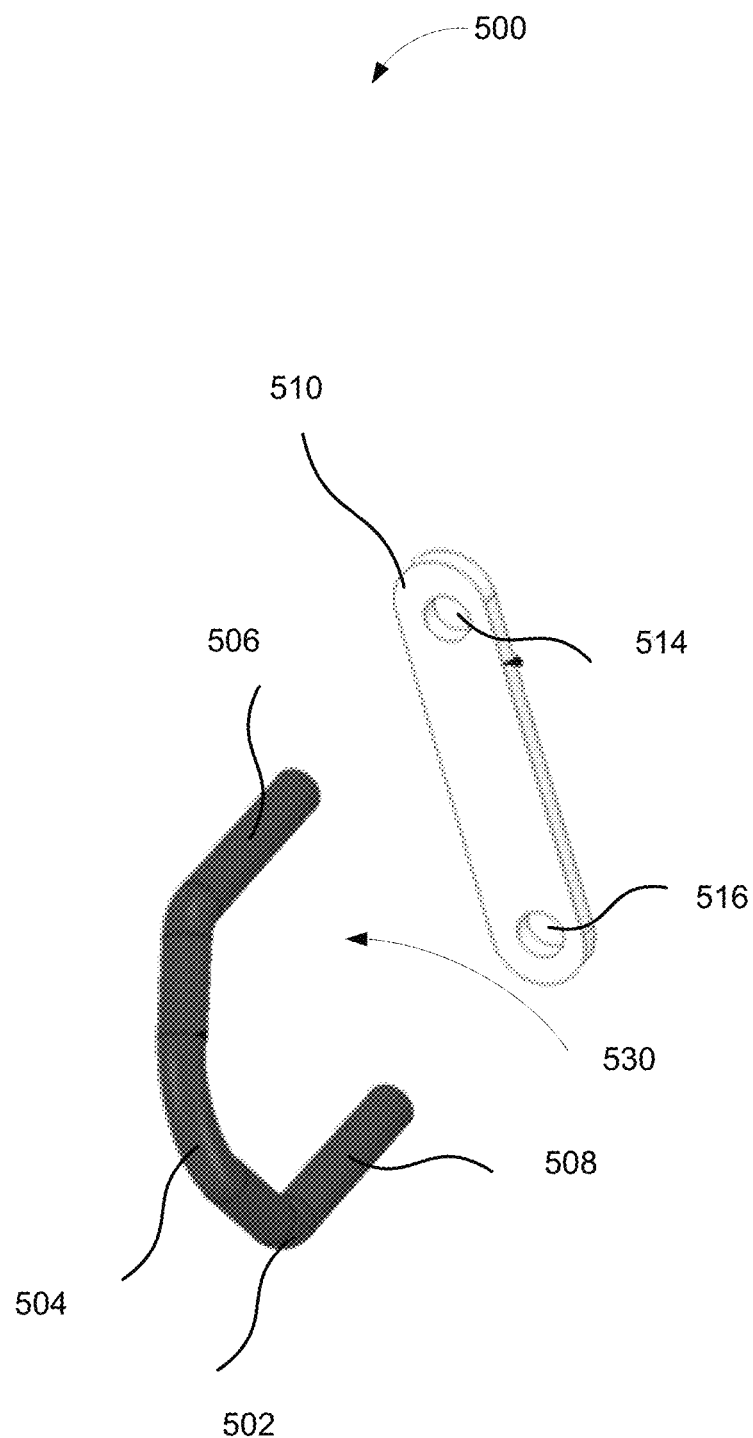
FIG. 5 schematically illustrates a 3-dimensional view of another example PCB mounting device configured to be removably coupled to a PCB to mount the PCB to a computing system chassis, in accordance with some embodiments.
Figure 6:
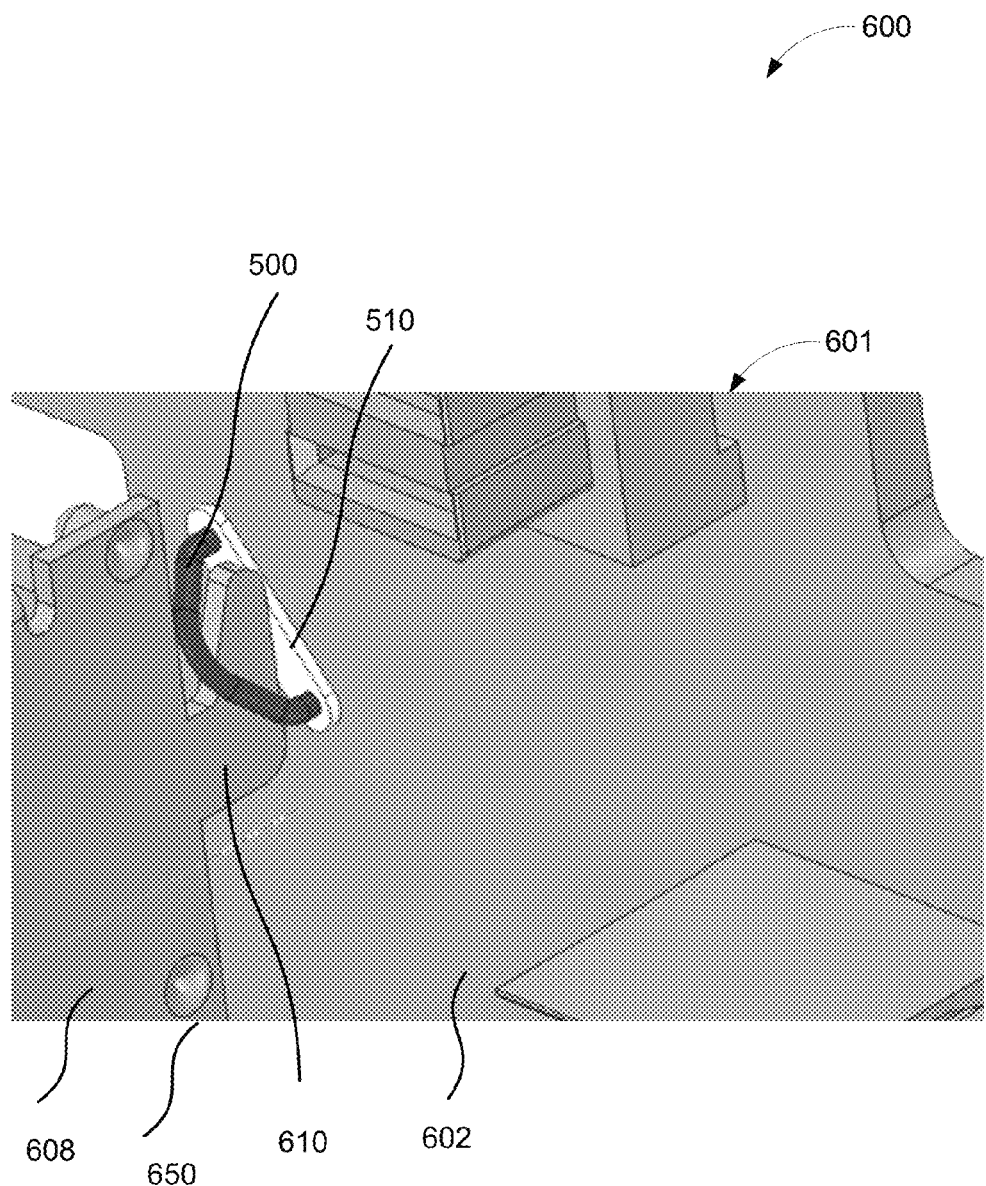
FIG. 6 schematically illustrates a 3-dimensional view of a portion of a PCB assembly with another example PCB mounting device mounted to a chassis of a computing system, in accordance with some embodiments.
Figure 7:
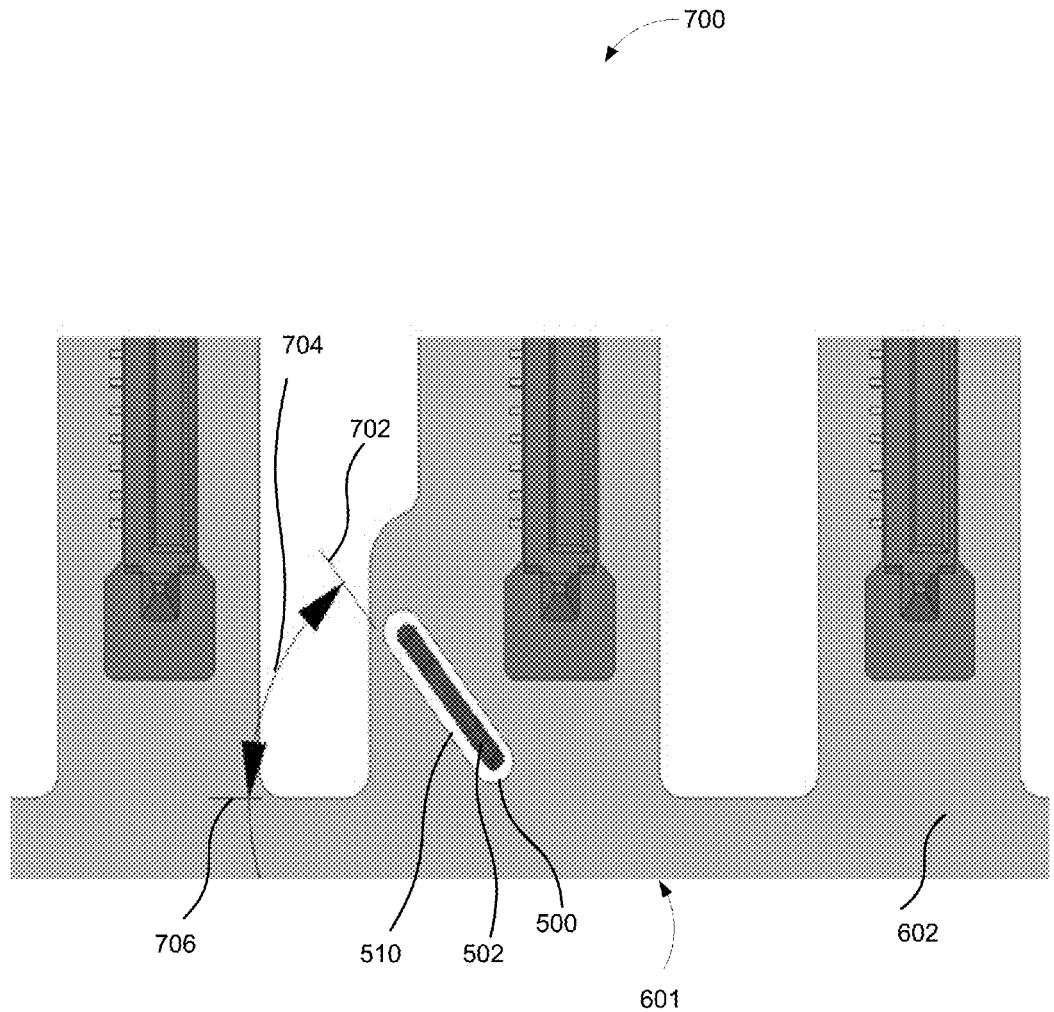
FIG. 7 schematically illustrates a back view of an example PCB assembly with an example PCB mounting device attached to a PCB, in accordance with some embodiments.

FIGS. 5-7 illustrate another embodiment of a PCB assembly with a PCB mounting device, in accordance with some embodiments. FIG. 5 schematically illustrates a 3-dimensional view of another example PCB mounting device 500 in a disassembled state, configured to be removably coupled to a PCB to mount the PCB to an electronic/computing system chassis, in accordance with some embodiments. The PCB mounting device 500 may include a substantially U-shaped component 502 having a non-linear or curved portion 504 and first and second rods 506, 508 extended from the non-linear or curved portion 504 (hereinafter, simply "curved" portion). In some embodiments, the U-shaped component 502 may comprises music wire or other suitable material with similar properties.

The PCB mounting device 500 may further include a housing 510 comprising a substantially elongated oval-shaped element, as shown. In some embodiments, the housing may comprise a plastic material or other material with similar characteristics. The housing 510 may have first and second apertures 514, 516 disposed (e.g., at a defined distance from each other) to receive the first and second rods 506, 508, respectively. Accordingly, the housing 510 may be configured to provide spacing for the first and second rods 506, 508.

The first and second rods 506, 508 may be extended through the respective apertures 514, 516 of the housing 510 such that the housing 510 and the curved portion 504 may form an opening 530 to engage a mounting element of the chassis, similar to the embodiments described above.

FIG. 6 schematically illustrates a 3-dimensional view 600 of a portion of a PCB assembly 601 with a PCB mounting device (e.g., 500 shown in FIG. 5) mounted to a chassis of an electronic/computing system, in accordance with some embodiments. The PCB assembly 601 may include a PCB 602 (similar to 102) and the PCB mounting device 500. The PCB 602 may include first and second holes (covered by the housing 510 in FIG. 6) configured to receive the first and second rods 506, 508. Similar to the embodiments described in reference to FIGS. 1-4, extended portions of the first and second rods 506, 508 may be inserted into and soldered to the first and second through holes of the PCB 602, respectively, to electrically couple the PCB 602 to the PCB mounting device 500 and a chassis 650, to ground the PCB 602 to the chassis 650. Similar to the embodiments described in reference to FIG. 3, the chassis 650 may include a partition wall 608 having a mounting element configured to receive the PCB mounting device 500 when the PCB assembly 601 is mounted to the chassis 650. The mounting element may comprise a hook-shaped component 610 extending from the partition wall 608, to engage with the opening 530 of the PCB mounting device 500 (as shown in FIG. 5).

FIG. 7 schematically illustrates a back view 700 of an example PCB assembly (e.g., 601) with a PCB mounting device (e.g., 500) attached to a PCB (e.g., 602) as described in reference to FIGS. 5-6, in accordance with some embodiments. The through holes (covered by the housing 510 in FIG. 7) may be disposed substantially along an axis 702 that forms an angle 704 with a horizontal side of the PCB indicated by a line 706. The angle 704 between the axis 702 and the horizontal side of the PCB 706 may be selected such as to provide cohesive mounting and desired grounding of the PCB 602 with the chassis 650 (FIG. 6) via the PCB mounting device 500. In some embodiments, the angle may comprise about 52 degrees, to ensure desired stiffness for the PCB assembly when mounted to the chassis. The first and second through holes and the U-shaped component 502 may be electrically plated to provide electric coupling between the PCB 602 and the PCB mounting device 500, to ensure desired grounding capability.

Figure 8:
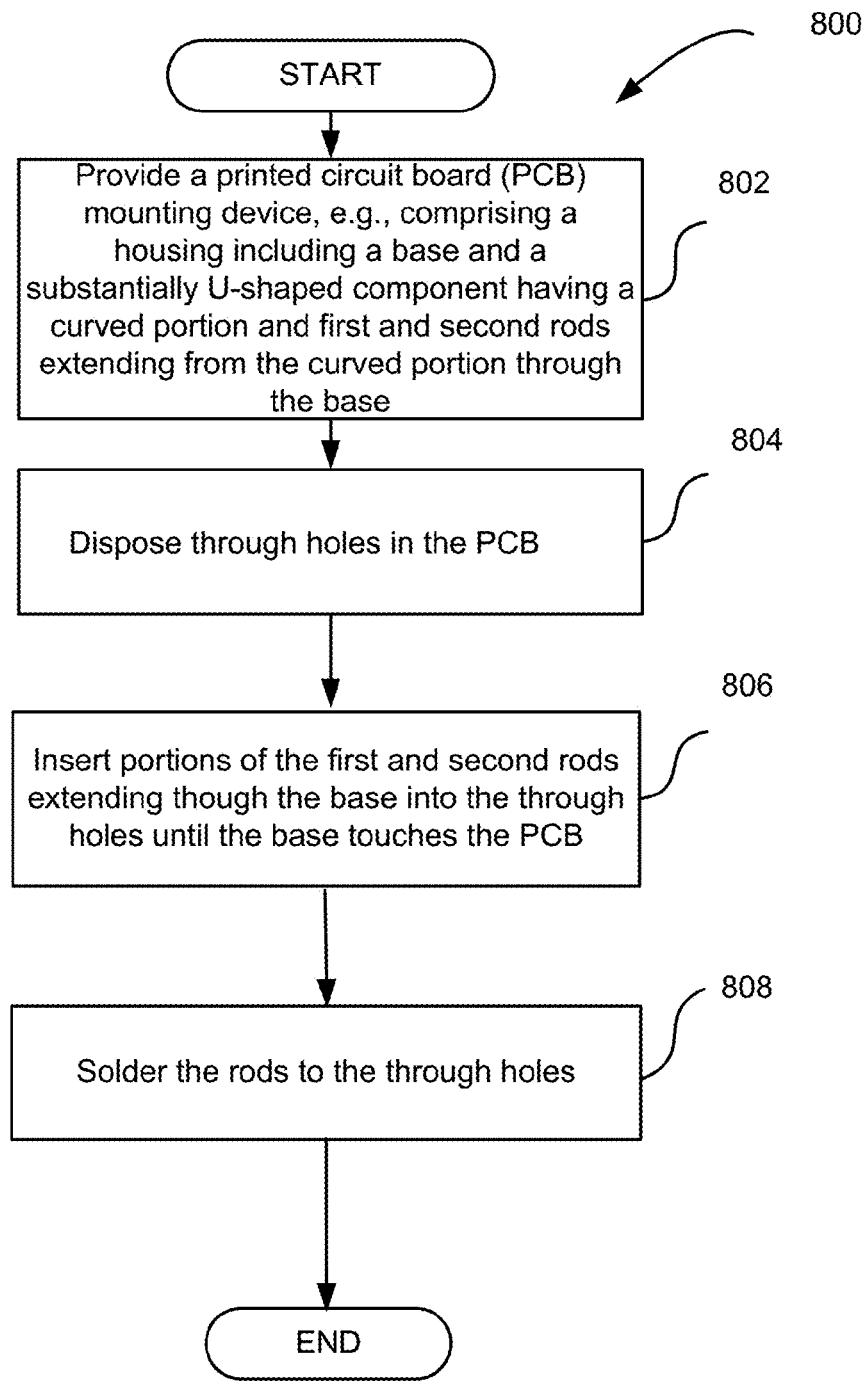
FIG. 8 is a process flow diagram for providing a PCB assembly with a PCB mounting device, in accordance with some embodiments.

FIG. 8 is a process flow diagram for providing a PCB assembly with a PCB mounting device, in accordance with some embodiments. The process 800 may comport with embodiments described in connection with FIGS. 1-7.

At block 802, a PCB mounting device may be provided. The term "providing" used herein may include manufacturing, fabricating or building the PCB mounting device as described below. For example, the PCB mounting device may comprise a device described in reference to FIG. 2. Accordingly, the PCB mounting device may comprise a housing having a base and a substantially U-shaped component having a curved portion and first and second rods extending from the curved portion through the base.

Providing the PCB mounting device may include forming the base of the PCB mounting device. Forming the base may include providing protrusions extending from each side of the base and etching guiding ribs on inner sides of each protrusion in a direction substantially parallel to the base, such that the ribs face each other, as described in reference to FIG. 2. Forming the base may further include disposing apertures in the protrusions at a distance from each other that corresponds to the distance between the rods.

Providing the PCB mounting device may further include inserting the first and second rods of the substantially U-shaped component through the apertures, thus providing an opening formed by the curved portion of the U-shaped component and the base with the protrusions of the housing.

In another example, the PCB mounting device may comprise a device described in reference to FIG. 5. In this example, the process of providing the PCB mounting device may follow the description of the device in reference to FIG. 5.

At block 804, through holes may be disposed in the PCB, in order to receive the first and second rods when the PCB mounting device is attached to the PCB.

At block 806, portions of the first and second rods extending through the base may be inserted into the through holes until the base touches the PCB.

At block 808, the rods may be soldered to the through holes, to ground the PCB via the PCB mounting device.

Figure 9:
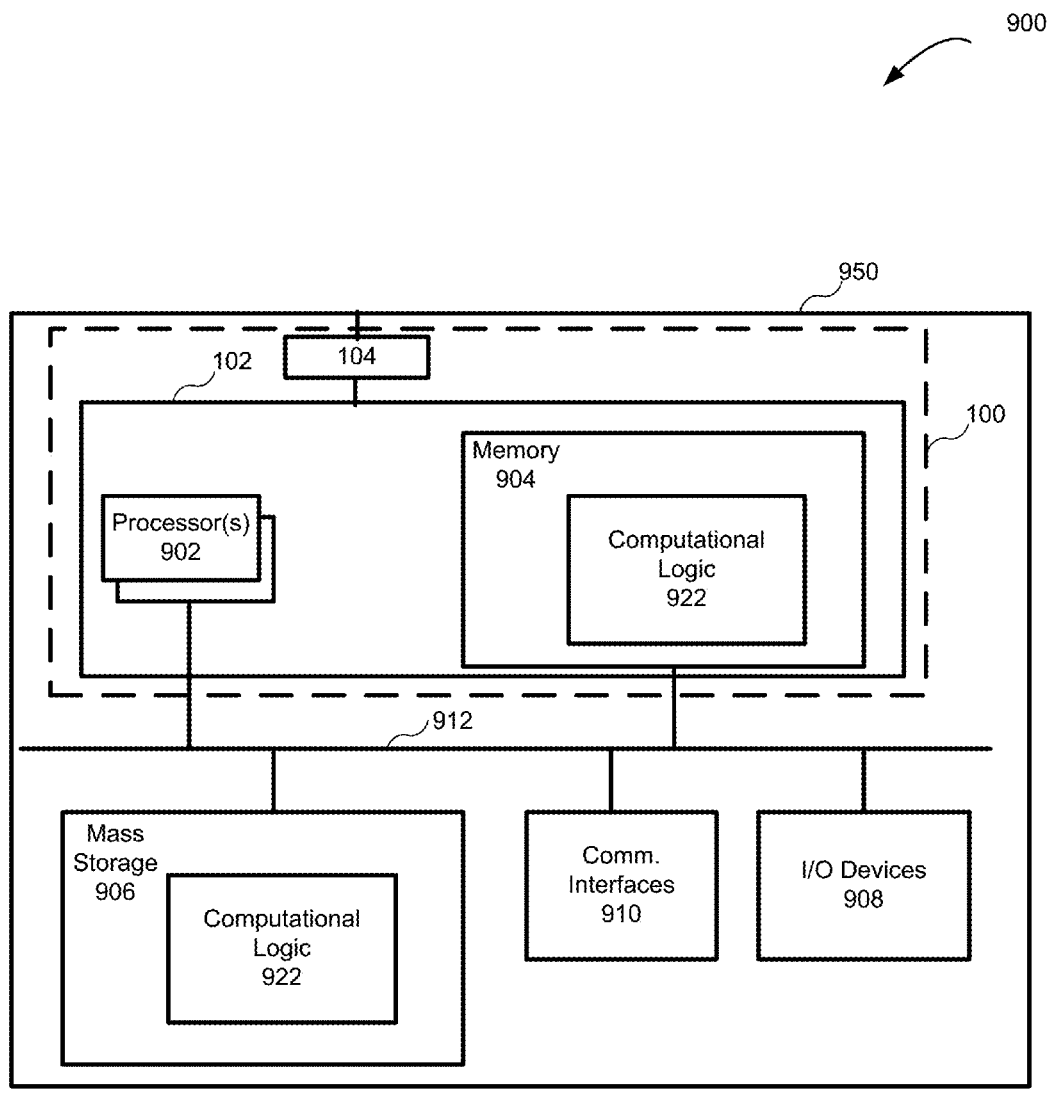
FIG. 9 schematically illustrates an example computing device including a PCB assembly with a PCB mounting device in accordance with some embodiments.

FIG. 9 schematically illustrates an example computing device 900 suitable for having various components of FIGS. 1-7, such as a PCB assembly with a PCB mounting device in accordance with some embodiments. As shown, computing device 900 may include one or more processors or processor cores 902 and system memory 904. For the purpose of this application, including the claims, the terms "processor" and "processor cores" may be considered synonymous, unless the context clearly requires otherwise. The processor 902 may include any type of processors, such as a central processing unit (CPU), a microprocessor, and the like. The processor 902 may be implemented as an integrated circuit having multi-cores, e.g., a multi-core microprocessor. The computing device 900 may include mass storage devices 906 (such as diskette, hard drive, volatile memory (e.g., dynamic random-access memory (DRAM), compact disc read-only memory (CD-ROM), digital versatile disk (DVD), and so forth). In general, system memory 904 and/or mass storage devices 906 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The computing device 900 may further include input/output devices 908 (such as a display (e.g., a touchscreen display), keyboard, cursor control, remote control, gaming controller, image capture device, and so forth) and communication interfaces 910 (such as network interface cards, modems, infrared receivers, radio receivers (e.g., Bluetooth), and so forth).

The communication interfaces 910 may include communication chips (not shown) that may be configured to operate the device 900 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 910 may operate in accordance with other wireless protocols in other embodiments.

The above-described computing device 900 elements may be coupled to each other via system bus 912, which may represent one or more buses. In the case of multiple buses, they may be bridged by one or more bus bridges (not shown). Each of these elements may perform its conventional functions known in the art. In particular, system memory 904 and mass storage devices 906 may be employed to store logic implementing an operating system and/or applications for the operation of the computing device 900, collectively referred to as computational logic 922. The various elements may be implemented by assembler instructions supported by processor(s) 902 or high-level languages that may be compiled into such instructions.

In some embodiments, as shown, at least some of the elements of the computing device 900 (e.g., processors 902, memory 904, communication chips (not shown) and/or other may be disposed on a PCB, such as the PCB 102 of FIG. 1. The PCB 102 may be mounted to a chassis 950 hosting all the illustrated elements (e.g., similar to chassis 304 of FIG. 3), with one or more PCB mounting device(s) 104, as earlier described.

The permanent copy of the programming instructions of computational logic 922 may be placed into mass storage devices 906 in the factory, or in the field, through, for example, a distribution medium (not shown), such as a compact disc (CD), or through communication interface 910 (from a distribution server (not shown)). That is, one or more distribution media having an implementation of the agent program may be employed to distribute the agent and to program various computing devices.

The number, capability, and/or capacity of the elements 908, 910, 912 may vary for different embodiments, depending on the functions and performance to be provided by computing device 900, e.g., whether computing device 900 is a single server, a collection of servers and the like. Their constitutions are otherwise known, and accordingly will not be further described.

In embodiments, at least one of processors 902 may be packaged together with memory 904 having computational logic 922, and configured to form a System in Package (SiP) or a System on Chip (SoC).

According to various embodiments, the present disclosure describes a number of examples. Example 1 is a printed circuit board (PCB) assembly, comprising: a PCB having first and second through holes; and at least one PCB mounting device removably coupled with the PCB to mount the PCB to a chassis, wherein the PCB mounting device includes: a substantially U-shaped component having a non-linear portion, and first and second rods extended from the non-linear portion; and a housing having a substantially quadrangular base with first and second protrusions extending from first and second ends of the base; wherein the first and second rods are extended through the protrusions, wherein the base with the protrusions and the non-linear portion of the U-shaped component form an opening to engage a mounting element of the chassis, and wherein extended portions of the first and second rods are to be inserted into and soldered to the first and second through holes of the PCB, respectively, to electrically couple the PCB to the PCB mounting device and the chassis to ground the PCB.

Example 2 may include the subject matter of Example 1, and further specifies that the non-linear portion of the substantially U-shaped component comprises one of a substantially tri-angular shape or a substantially circular arc shape.

Example 3 may include the subject matter of Example 1, and further specifies that the first and second through holes and the U-shaped component are electrically plated.

Example 4 may include the subject matter of Example 1, and further specifies that the first and second through holes provide electrical connection of a ground plane of the PCB with the first and second rods.

Example 5 may include the subject matter of Example 1, and further specifies that the protrusions of the housing include guiding ribs that extend from the protrusions substantially parallel to the base toward each other, to form a channel in the opening to guide the mounting element of the chassis through the opening.

Example 6 may include the subject matter of Example 5, and further specifies that the mounting element comprises a hook-shaped component extending from a partition wall of the chassis, to lockably or frictionally engage with the opening of the PCB mounting device.

Example 7 may include the subject matter of Example 6, and further specifies that the hook-shaped component includes a base section having a grounding clip attached to the base section to receive at least a portion of the non-linear portion of the U-shaped component, to contribute to the grounding of the PCB.

Example 8 may include the subject matter of Examples 1 to 7, and further specifies that the PCB comprises a substantially quadrangular shape, wherein the first and second through holes are disposed along a plane that is substantially parallel to one side of the quadrangle.

Example 9 is a printed circuit board (PCB) mounting device, comprising: a substantially U-shaped component having a non-linear portion and first and second rods extended from the non-linear portion; and a housing having a substantially quadrangular base with first and second protrusions around each end of the base to receive the first and second rods respectively, wherein the base with the protrusions and the non-linear portion form an opening; wherein the first and second rods are extended through the protrusions to be insertable into respective through holes provided in a PCB, to couple the PCB mounting device to the PCB, wherein the rods are solderable to the through holes, to provide grounding of the PCB via the PCB mounting device.

Example 10 may include the subject matter of Example 9, and further specifies that the PCB mounting device is to mount the PCB to a chassis, wherein the protrusions of housing include guiding ribs that extend from the protrusions toward each other, to form a channel in the opening to guide a mounting element of the chassis through the opening.

Example 11 may include the subject matter of Examples 9 to 10, and further specifies that the rods are electrically plated.

Example 12 is a method for providing a printed circuit board (PCB) with a PCB mounting device, comprising: providing a PCB mounting device, the PCB mounting device comprising a housing including a base and a substantially U-shaped component having a non-linear portion and first and second rods extending from the non-linear portion through the base; disposing through holes in a PCB; inserting portions of the first and second rods extending though the base into the through holes until the base touches the PCB; and soldering the rods to the through holes, to ground the PCB via the PCB mounting device.

Example 13 may include the subject matter of Example 12, and further specifies that providing the PCB mounting device comprises: providing protrusions extending from each side of the base; etching guiding ribs on inner sides of each protrusion in a direction substantially parallel to the base, the ribs facing each other.

Example 14 may include the subject matter of Example 13, and further specifies that providing the PCB mounting device comprises: disposing apertures in the protrusions at a distance from each other that corresponds to a distance between the first and second rods; and inserting the first and second rods of the substantially U-shaped component through the apertures, providing an opening formed by the non-linear portion of the U-shaped component and the base with the protrusions of the housing.

Example 15 is a printed circuit board (PCB) assembly comprising: a PCB having first and second through holes that extend through the PCB, wherein the through holes are disposed substantially along an axis that forms an angle with a horizontal side of the PCB; and at least one PCB mounting device removably coupled with the PCB to mount the PCB to a chassis, the PCB mounting device including: a substantially U-shaped component having a non-linear portion and first and second rods extended from the non-linear portion; and a housing having first and second apertures disposed to receive the first and second rods respectively, wherein the first and second rods are extended through the respective apertures of the housing, wherein the housing and the non-linear portion form an opening to engage a mounting element of the chassis, wherein extended portions of the first and second rods are inserted into and soldered to the first and second through holes of the PCB respectively, to electrically couple the PCB to the PCB mounting device and the chassis to ground the PCB.

Example 16 may include the subject matter of Example 15, and further specifies that the angle between the axis and the horizontal side of the PCB comprises about 52 degrees.

Example 17 may include the subject matter of Example 15, and further specifies that the first and second through holes and the U-shaped component are electrically plated.

Example 18 may include the subject matter of Example 15, and further specifies that the mounting element comprises a hook-shaped component extending from a partition wall of the chassis, to engage with the opening of the PCB mounting device.

Example 19 may include the subject matter of Example 15, and further specifies that the U-shaped component comprises music wire.

Example 20 may include the subject matter of Examples 15 to 19, and further specifies that the housing comprises a substantially elongated oval-shaped element to provide spacing for the first and second rods.

Example 21 is a computing system with a printed circuit board (PCB) assembly comprising: a chassis and a PCB assembly coupled with the chassis, wherein the PCB assembly includes: a PCB having first and second through holes and at least one PCB mounting device removably coupled with the PCB to couple the PCB with the chassis, wherein the PCB mounting device includes: a substantially U-shaped component having a non-linear portion, and first and second rods extended from the non-linear portion; and a housing having a substantially quadrangular base with first and second protrusions extending from first and second ends of the base; wherein the first and second rods are extended through the protrusions, wherein the base with the protrusions and the non-linear portion of the U-shaped component form an opening to engage a mounting element of the chassis, and wherein extended portions of the first and second rods are inserted into and soldered to the first and second through holes of the PCB, respectively, to electrically couple the PCB to the PCB mounting device and the chassis to ground the PCB.

Example 22 may include the subject matter of Example 21, and further specifies that the first and second through holes provide electrical connection of a ground plane of the PCB with the first and second rods.

Example 23 may include the subject matter of Examples 21 to 22, and further specifies that the protrusions of the housing include guiding ribs that extend from the protrusions substantially parallel to the base toward each other, to form a channel in the opening to guide the mounting element of the chassis through the opening.

Example 24 may include the subject matter of Example 23, and further specifies that the mounting element comprises a hook-shaped component extending from a partition wall of the chassis, to lockably or frictionally engage with the opening of the PCB mounting device.

Example 25 may include the subject matter of Example 24, and further specifies that the hook-shaped component includes a base section having a grounding clip attached to the base section to receive at least a portion of the non-linear portion of the U-shaped component, to contribute to the grounding of the PCB.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A printed circuit board (PCB) assembly comprising:
a PCB having first and second through holes; and
at least one PCB mounting device coupled with the PCB to mount the PCB to a chassis, wherein the PCB mounting device includes:
  a substantially U-shaped component having a non-linear portion, and first and second rods extending from the non-linear portion; and
  a housing having a substantially quadrangular base with first and second protrusions extending from first and second ends of the base;
wherein the first and second rods extend through the protrusions,
wherein the protrusions include guiding ribs,
wherein the base with the protrusions and the non-linear portion of the U-shaped component form an opening to engage a mounting element of the chassis, and
wherein extended portions of the first and second rods are inserted into and soldered to the first and second through holes of the PCB, respectively, to electrically couple the PCB to the PCB mounting device and the chassis to ground the PCB.

2. The PCB assembly of claim 1, wherein the non-linear portion of the substantially U-shaped component comprises one of a substantially tri-angular shape or a substantially circular arc shape.

3. The PCB assembly of claim 1, wherein the first and second through holes and the U-shaped component are electrically plated.

4. The PCB assembly of claim 1, wherein the first and second through holes provide electrical connection to a ground plane of the PCB with the first and second rods.

5. The PCB assembly of claim 1, wherein the guiding ribs extend from the protrusions substantially parallel to the base toward each other, to form a channel in the opening to guide the mounting element of the chassis through the opening.

6. The PCB assembly of claim 5, wherein the mounting element comprises a hook-shaped component extending from a partition wall of the chassis, to lockably or frictionally engage with the opening of the PCB mounting device.

7. The PCB assembly of claim 6, wherein the hook-shaped component includes a base section having a grounding clip attached to the base section to receive at least a portion of the non-linear portion of the U-shaped component, to contribute to the grounding of the PCB.

8. The PCB assembly of claim 1, wherein the PCB comprises a substantially quadrangular shape, wherein the first and second through holes are disposed along a plane that is substantially parallel to one side of the quadrangle.

9. A printed circuit board (PCB) mounting device, comprising:
a substantially U-shaped component having a non-linear portion and first and second rods extending from the non-linear portion;
a housing having a base with first and second protrusions around each end of the base to receive the first and second rods respectively, wherein the base with the protrusions and the non-linear portion form an opening;
wherein the first and second rods extend through the protrusions,
wherein the protrusions include guiding ribs; and
wherein extended portions of the first and second rods, when inserted into and soldered to first and second through holes of the PCB, respectively, are to electrically couple the PCB to the PCB mounting device and a chassis to ground the PCB.

10. The PCB mounting device of claim 9, wherein the guiding ribs extend from the protrusions toward each other, to form a channel in the opening to guide a mounting element of the chassis through the opening.

11. The PCB mounting device of claim 9, wherein the rods are electrically plated.

12. A method, comprising:
disposing through holes in a printed circuit board (PCB) mounting device, the PCB mounting device comprising a housing including a base and a substantially U-shaped component having a non-linear portion and first and second rods extending from the non-linear portion through the base;
providing protrusions extending from each side of the base, wherein the protrusions include guiding ribs;
inserting portions of the first and second rods extending through the base into the through holes until the base touches the PCB; and
soldering the rods to the through holes, to ground the PCB via the PCB mounting device to a chassis.

13. The method of claim 12, wherein providing protrusions further comprises:
etching the guiding ribs on inner sides of each protrusion in a direction substantially parallel to the base, the ribs facing each other.

14. The method of claim 13, wherein providing the PCB mounting device comprises:
disposing apertures in the protrusions at a distance from each other that corresponds to a distance between the first and second rods; and
inserting the first and second rods of the substantially U-shaped component through the apertures, providing an opening formed by the non-linear portion of the U-shaped component and the base with the protrusions of the housing.

15. A printed circuit board (PCB) assembly comprising:
a PCB having first and second through holes that extend through the PCB, wherein the through holes are disposed substantially along an axis that forms a non-zero angle with a horizontal side of the PCB; and at least one PCB mounting device coupled with the PCB to mount the PCB to a chassis, the PCB mounting device including:
   a substantially U-shaped component having a non-linear portion and first and second rods extended from the non-linear portion; and
   a housing having first and second apertures disposed to receive the first and second rods respectively, wherein the first and second rods are extended through the respective apertures of the housing, wherein the housing and the non-linear portion form an opening to engage a mounting element of the chassis, wherein the housing between the apertures includes guiding ribs, and
wherein extended portions of the first and second rods are inserted into and soldered to the first and second through holes of the PCB respectively, to electrically couple the PCB to the PCB mounting device and the chassis to ground the PCB.

16. The PCB assembly of claim 15, wherein the angle between the axis and the horizontal side of the PCB comprises about 52 degrees.

17. The PCB assembly of claim 15, wherein the first and second through holes and the U-shaped component are electrically plated.

18. The PCB assembly of claim 15, wherein the mounting element comprises a hook-shaped component extending from a partition wall of the chassis, to engage with the opening of the PCB mounting device.

19. The PCB assembly of claim 15, wherein the U-shaped component comprises music wire.

20. The PCB assembly of claim 15, wherein the housing comprises a substantially elongated oval-shaped element to provide spacing for the first and second rods.

21. A computing system comprising:
   a chassis and a printed circuit board (PCB) assembly coupled with the chassis, wherein the PCB assembly includes:
      a PCB having first and second through holes; and
      at least one PCB mounting device coupled with the PCB to couple the PCB with the chassis, wherein the PCB mounting device includes: a substantially U-shaped component having a non-linear portion, and first and second rods extending from the non-linear portion; and
      a housing having a base with first and second protrusions extending from first and second ends of the base;
   wherein the first and second rods extend through the protrusions, wherein the base with the protrusions and the non-linear portion of the U-shaped component form an opening to engage a mounting element of the chassis, wherein the housing between the protrusions include guiding ribs, and wherein extended portions of the first and second rods are inserted into and soldered to the first and second through holes of the PCB, respectively, to electrically couple the PCB to the PCB mounting device and the chassis to ground the PCB.

22. The computing system of claim 21, wherein the first and second through holes provide electrical connection of a ground plane of the PCB with the first and second rods.

23. The computing system of claim 21, wherein the guiding ribs extend from the protrusions substantially parallel to the base toward each other, to form a channel in the opening to guide the mounting element of the chassis through the opening.

24. The computing system of claim 23, wherein the mounting element comprises a hook-shaped component extending from a partition wall of the chassis, to lockably or frictionally engage with the opening of the PCB mounting device.

25. The computing system of claim 24, wherein the hook-shaped component includes a base section having a grounding clip attached to the base section to receive at least a portion of the non-linear portion of the U-shaped component, to contribute to the grounding of the PCB.

* * * * *